US006867441B1

(12) United States Patent
Yang et al.

(10) Patent No.: US 6,867,441 B1
(45) Date of Patent: Mar. 15, 2005

(54) METAL FUSE STRUCTURE FOR SAVING LAYOUT AREA

(75) Inventors: Chao-Hsiang Yang, Hsin-chu (TW); Charles Chen, Hsinchu (TW); Wesley Lin, Hsin-chu (TW); Harry Chuang, Austin, TX (US); Ming-Hsin Li, Hsinchu (TW); Jeng-Long Huang, Dan Shai (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/681,656

(22) Filed: Oct. 8, 2003

(51) Int. Cl.[7] .............................................. H01L 27/10
(52) U.S. Cl. ....................... 257/209; 257/529; 257/665; 438/132; 438/467; 438/601
(58) Field of Search ................. 257/209, 529, 257/665; 438/132, 467, 601

(56) References Cited

U.S. PATENT DOCUMENTS 5,970,346 A * 10/1999 Liaw
6,100,118 A * 8/2000 Shih et al.
6,444,544 B1 * 9/2002 Hu et al.

* cited by examiner

*Primary Examiner*—Thien F Tran
(74) *Attorney, Agent, or Firm*—Duane Morris LLP

(57) ABSTRACT

A fuse structure for a semiconductor device on a substrate includes a fuse having an electrically conductive fuse line of a standard fuse length formed in an electrically conductive layer disposed over the substrate, and a pair of electrically conductive, inwardly bent interconnects formed in a first plurality of electrically conductive layers disposed over the substrate, below the electrically conductive layer in which the fuse line is formed. The inwardly bent interconnects couple the fuse line to a circuit area of the substrate disposed under the fuse line. The fuse structure may further include a protective guard ring formed around the fuse. The guard ring includes a second plurality of electrically conductive interconnects.

21 Claims, 2 Drawing Sheets

METAL FUSE STRUCTURE FOR SAVING LAYOUT AREA

FIELD OF THE INVENTION

This invention relates to integrated circuits and semiconductors devices and, more particularly, to a laser fuse structure that provides a savings in chip area, the saved chip area being useable for routing circuits.

BACKGROUND OF THE INVENTION

Laser fuses can be used to rewire memory and logic circuits. For example, in dynamic or static memory chips, defective memory cells may be replaced by blowing fuses associated with the defective cells, and activating a spare row or column of cells. This circuit rewiring using fusible links allows considerable enhanced yields and reduces the production costs. Also, logic circuits may also be repaired or reconfigured by blowing fuses. For example, it is common to initially fabricate a generic logic chip having a large number of interconnected logic gates. Then, in a final processing step, the chip is customized to perform a desired logic function by disconnecting the unnecessary logic elements by blowing the fuses that connect them to the desired circuitry. Still other applications of laser-blown fuses are possible.

Although deep sub-micron technology is advancing such that transistors and interconnects are continuing to shrink in size, the size of laser fuses is becoming limited by the resolution of the laser machine. Historically, the laser fuse design rules have shrunk less compared to those of transistors and interconnects. Hence, the chip area occupied by laser fuse continues to increase as deep sub-micron technology advances.

Conventional fuse structures include a fuse window, a laser fuse disposed below the fuse window, and a protective guard ring formed around the fuse. The fuse area is typically defined by the area within the guard ring. Unfortunately in such conventional fuse designs, no circuits can be placed directly beneath the fuse area because the guard ring and laser fuse occupy this chip area.

Accordingly, a fuse structure is needed that saves chip area under the laser fuse area which can be used for routing circuits.

SUMMARY OF THE INVENTION

According to an aspect of the invention, a fuse structure for a semiconductor device on a substrate. The fuse structure includes a fuse including an electrically conductive fuse line of a standard fuse length formed in an electrically conductive layer disposed over the substrate, and a pair of electrically conductive, inwardly bent interconnects formed in a first plurality of electrically conductive layers disposed over the substrate, below the electrically conductive layer in which the fuse line is formed. The inwardly bent interconnects couple the fuse line to a circuit area of the substrate disposed under the fuse line.

The fuse structure may further include a protective guard ring formed around the fuse. The guard ring includes a second plurality of electrically conductive interconnects.

According to another aspect of the invention, a method of making a fuse structure for a semiconductor device on a substrate having a circuit area. The method includes forming a pair of electrically conductive, inwardly bent fuse interconnects having first and second ends, in a plurality of electrically conductive layers disposed over the substrate, and forming an electrically conductive fuse line of a standard fuse length in an electrically conductive layer disposed above the plurality of electrically conductive layers. The first ends of the fuse interconnects are electrically coupled to the circuit area, and the fuse line is electrically coupled to the second ends of the fuse interconnects.

The method may further include the step of forming a second plurality of electrically conductive interconnects around the fuse. The second plurality of electrically conductive interconnects define a protective guard ring.

DETAILED DESCRIPTION OF THE INVENTION

The present invention is a laser fuse structure for integrated circuits and semiconductor devices. The laser fuse structure minimizes chip area in a manner that allows circuit routing under the laser fuse.

Figure 2:
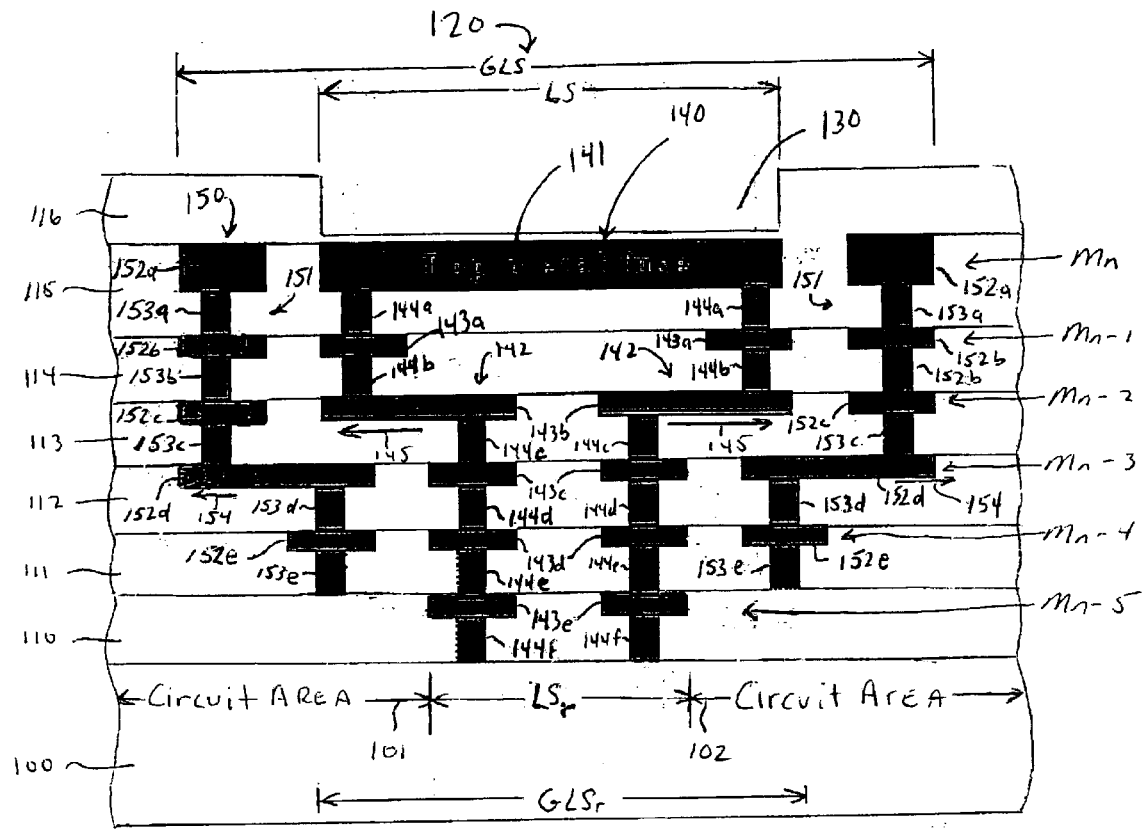
FIG. 2 is a sectional view through line 1—1 of the laser fuse structure of FIG. 1.
Figure 1:
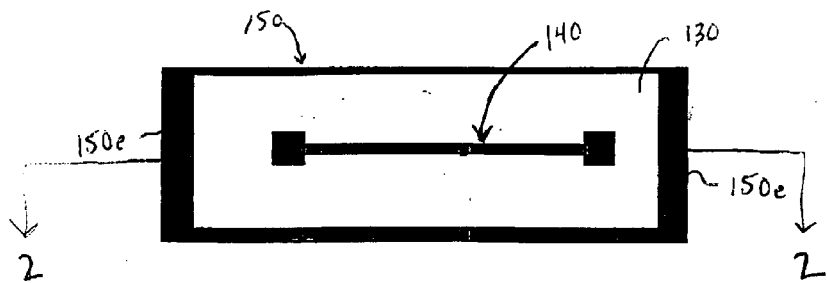
FIG. 1 is a top plan view of a laser fuse structure according to a first embodiment of the present invention.

FIGS. 1 and 2 depict a laser fuse structure 120 according to a first embodiment of the present invention. The laser fuse structure 120 is disposed over a chip or substrate 100 and may be generally formed from metal lines and metal interconnects in a plurality of metal layers Mn, Mn-1, Mn-2, Mn-3, Mn-4, and Mn-5 that extend through insulating dielectric layers 110–115 (FIG. 2). The metal lines and interconnects are typically used for global routings. The laser fuse structure 120 includes a fuse window 130, a laser fuse 140 disposed below the fuse window 130, and a protective guard ring 150 formed around the fuse 140 (FIG. 1).

As shown in FIG. 2, the fuse window 130 may extend through a portion of top insulating dielectric layer 116 such that a thin portion of the layer 116 remains above the fuse 140. The fuse window 130 may be conventionally formed to meet standard laser repair specifications.

The laser fuse 140 may be formed of a standard fuse length in top metal layer Mn by metal line 141. The metal line 141 has connected at its ends by a pair of inwardly bent metal interconnects 142. The metal interconnects 142 may be in metal layers Mn through Mn-5, which extend down through insulating dielectric layers 115–110. The metal interconnects 142 couple the fuse metal line 141 to circuits and metal circuit routings formed in underlying circuits areas 101 and 102 of the substrate 100. The metal fuse line 141 and its metal interconnects 142 substantially form a novel T- or funnel-shape structure that uses significantly less chip or substrate area underneath the fuse 140, than that normally used by conventional laser fuse structures, while still allowing for a standard fuse length SFL. The area underneath the fuse 140 not used by the fuse interconnects 142 of the present invention, can now be used for circuits and circuit routing as depicted by the circuit areas 101 and 102, which extend at least partially under the fuse 140.

The metal fuse interconnects 142 may be constructed from metal lines 143a through 143e which are formed respectively in metal layers Mn-1 through Mn-5, and metal filled vias 144a through 144f which are formed respectively in metal layers Mn through Mn-5 and connect the metal lines 143a through 143e. The metal lines 143c through 143e in metal layers Mn-3 through Mn-5 have a reduced line spacing $LS_r$, which is less than the standard fuse length. The metal lines 143b in metal layer Mn-2 are laterally extended in the direction of arrows 145 to provide a conventional line spacing of LS, which meets the standard fuse length. The metal lines 143a in metal layer Mn-1 are conventionally spaced to line spacing LS to meet the standard fuse length.

The guard ring 150 may be constructed from metal interconnects 151 in metal layers Mn through Mn-4, and through dielectric layers 115 through 111. As shown in FIG. 1, the interconnects 151 form a ring like structure around the fuse 140 which in the shown embodiment may be rectangular.

Referring again to FIG. 2, the interconnects 151 forming ends walls 150e of the guard ring 150 are bent inwardly in a manner that may substantially mimic the fuse interconnects 142. The guard ring interconnects 151 may be formed from metal lines 152a through 152e, which are formed respectively in metal layers Mn through Mn-4, and metal filled vias 153a through 153e which are formed respectively in metal layers Mn through Mn-4. Thus, the guard ring interconnects 151 substantially form a novel T- or funnel-shape structure. The metal lines 152e in metal layer Mn-4 have a reduced guard line spacing $GLS_T$. The portions of the metal lines 152d in metal layer Mn-3, which form the end walls 153e of the guard ring 150, are laterally extended in the direction of arrows 154 to provide a conventional guard line spacing of GLS. The metal lines 152a through 152c formed respectively in metal layers Mn through Mn-2 are conventionally spaced to the guard line spacing GLS. The interconnects forming the side walls of the guard ring 150 may also be formed in a funnel-shape.

Figure 3:
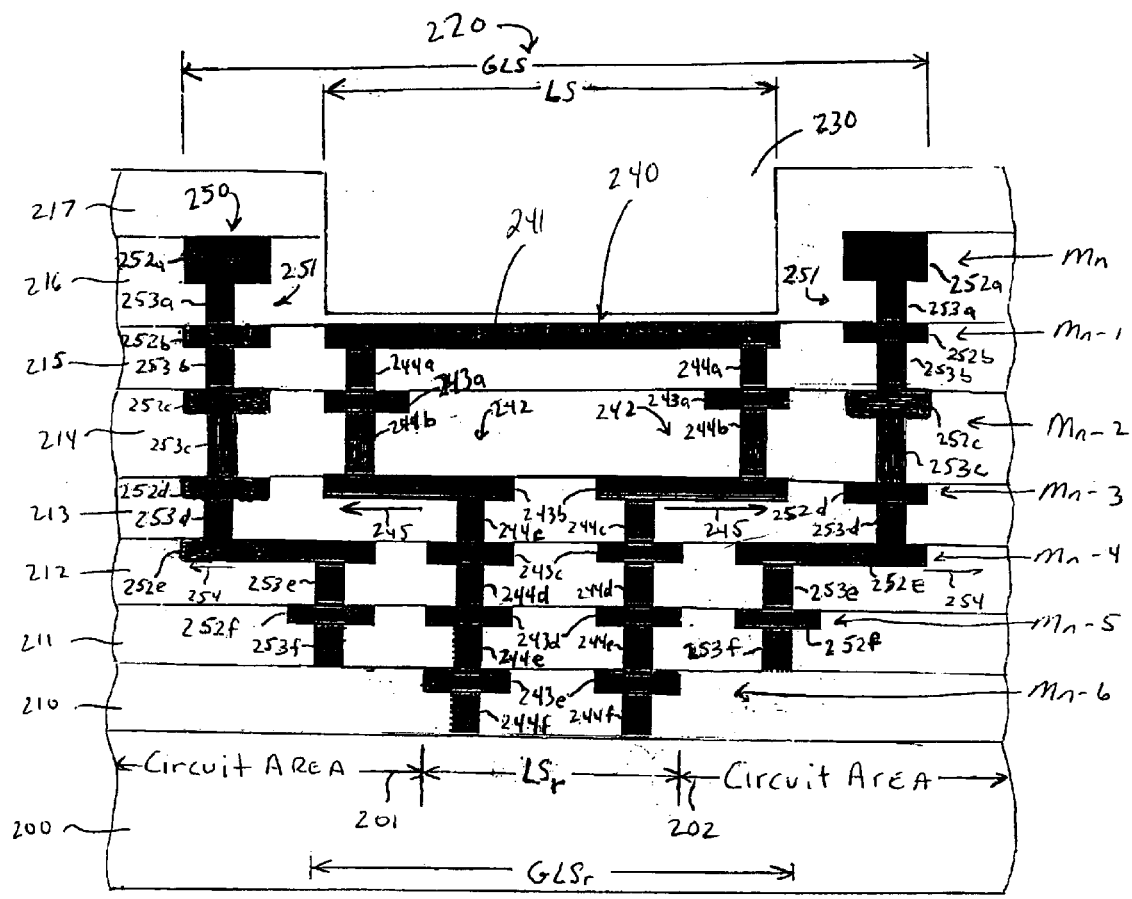
FIG. 3 is a sectional view of a laser fuse structure according to a second embodiment of the present invention.

FIG. 3 is a sectional view of a laser fuse structure 220 according to a second embodiment of the present invention. The laser fuse structure 220 of the second embodiment is generally the same as the first embodiment, except that the laser fuse is formed in one of the metal layers below the top metal layer Mn. More specifically, the laser fuse structure 220 is disposed over a chip or substrate 200 and may be generally formed from metal lines and metal interconnects in a plurality of metal layers Mn, Mn-1, Mn-2, Mn-3, Mn-4, Mn-5, and Mn-6 that extend through insulating dielectric layers 210–216.

The fuse window 230 may extend through portions of the top two insulating dielectric layers 217, and 216 such that a thin portion of the second layer 216 remains above the fuse 240. The laser fuse 240 may be formed of a standard fuse length in the second metal layer Mn-I by metal line 241. The metal line 241 has connected at its ends a pair of inwardly bent metal interconnects 242 that together substantially form a novel T- or funnel-shape structure as in the first embodiment. The metal interconnects 242 may be in metal layers Mn-1 through Mn-6, which extend through insulating dielectric layers 215–210. The metal interconnects 242 couple the fuse metal line 241 to circuits and metal circuit routings formed in circuits areas 201 and 202 of the substrate 200.

The metal fuse interconnects 242 in the second embodiment of the invention may be constructed from metal lines 243a through 243e which are formed respectively in metal layers Mn-2 through Mn-6, and metal filled connecting vias 244a through 244f which are formed respectively in metal layers Mn-I through Mn-6. The metal lines 243c through 243e in metal layers Mn-4 through Mn-6 have a reduced line spacing $LS_r$, which is less than the standard fuse length. The metal lines 243b in metal layer Mn-3 are laterally extended in the direction of arrows 245 to provide a conventional line spacing of LS, which meets the standard fuse length. The metal lines 243a in metal layer Mn-2 are conventionally spaced to line spacing LS to meet the standard fuse length.

The guard ring 250 may be constructed from metal interconnects 251 in metal layers Mn through Mn-5, and through dielectric layers 216 through 211. As in the first embodiment, the interconnects 251 forming ends walls of the guard ring 250 of the second embodiment are bent inwardly in a manner that may substantially mimic the fuse interconnects 242. The guard ring interconnects 251 may be formed from metal lines 252a through 252f which are formed respectively in metal layers Mn through Mn-5, and metal filled connecting vias 253a through 253f which are formed respectively in metal layers Mn through Mn-5. Thus, the guard ring interconnects 251 substantially form a novel funnel-shape structure. The metal lines 252f in metal layer Mn-5 have a reduced guard line spacing $GLS_T$. The end wall portions of the metal lines 252f in metal layer Mn-5 are laterally extended in the direction of arrows 254 to provide a conventional guard line spacing of GLS. The metal lines 252a through 252d formed respectively in metal layers Mn through Mn-3 are conventionally spaced to the guard line spacing GLS.

One of ordinary skill in the art will appreciate that the laser fuse and the guard ring of the fuse structure of the present invention may each be formed from metal lines and metal interconnects in any number of metal layers. In addition, the metal interconnects may extend through any number of insulating dielectric layers.

The laser fuse structure of present invention can be fabricated using conventional integrated circuit and semiconductor fabrication methods, which are very well known to persons skilled in the art. The fuse, interconnects and guard ring can be formed of polysilicon or metals including without limitation aluminum, tungsten, titanium nitride, suicides, copper and metal alloys.

While the foregoing invention has been described with reference to the above embodiments, various modifications and changes can be made without departing from the spirit of the invention. Accordingly, all such modifications and changes are considered to be within the scope of the appended claims.

What is claimed is:

1. A fuse structure for a semiconductor device on a substrate, the fuse structure comprising:
    a fuse including:
        an electrically conductive fuse line of a standard fuse length formed in an electrically conductive layer disposed over the substrate; and
        a pair of electrically conductive, inwardly bent interconnects formed in a first plurality of electrically conductive layers disposed over the substrate, below the electrically conductive layer in which the fuse line is formed, the interconnects for coupling the fuse line to a circuit area of the substrate disposed under the fuse line.

2. The fuse structure according to claim 1, further comprising a plurality of dielectric layers disposed over the substrate, the interconnects extending through at least some of the dielectric layers.

3. The fuse structure according to claim 1, wherein the fuse line and interconnects form a substantially funnel-shape structure.

4. The fuse structure according to claim 1, further comprising a second plurality of electrically conductive interconnects disposed around the fuse, the second plurality of electrically conductive interconnects formed in the electrically conductive layer in which the fuse is formed and in a predetermined number of the plurality of electrically conductive layers.

5. The fuse structure according to claim 1, further comprising a second plurality of electrically conductive interconnects disposed around the fuse, the second plurality of electrically conductive interconnects formed in an electrically conductive layer above the electrically conductive layer in which the fuse is formed, in the electrically conductive layer in which the fuse is formed and in a predetermined number of the plurality of electrically conductive layers.

6. The fuse structure according to claim 1, further comprising a fuse window disposed above the fuse.

7. The fuse structure according to claim 6, wherein the fuse window is defined in a dielectric layer disposed over the substrate.

8. The fuse structure according to claim 1, further comprising a protective guard ring formed around the fuse, the guard ring including a second plurality of electrically conductive interconnects.

9. The fuse structure according to claim 8, further comprising a plurality of dielectric layers disposed over the substrate, the interconnects of the fuse and guard ring extending through at least some of the dielectric layers.

10. The fuse structure according to claim 8, wherein the fuse line and interconnects form a substantially funnel-shape structure and the guard ring interconnects form a substantially funnel-shape structure.

11. The fuse structure according to claim 8, wherein portions of the interconnects forming side walls of the guard ring are bent inwardly in a manner that follows the interconnects of the fuse.

12. The fuse structure according to claim 8, wherein portions of the interconnects forming end walls of the guard ring are bent inwardly in a manner that follows the interconnects of the fuse.

13. The fuse structure according to claim 12, wherein portions of the interconnects forming side walls of the guard ring are bent inwardly in a manner that follows the interconnects of the fuse.

14. The fuse structure according to claim 8, further comprising a fuse window disposed above the fuse.

15. The fuse structure according to claim 14, wherein the fuse window is defined in a dielectric layer disposed over the substrate.

16. A method of making a fuse structure for a semiconductor device on a substrate having a circuit area, the method comprising:

forming a pair of electrically conductive, inwardly bent fuse interconnects having first and second ends, in a plurality of electrically conductive layers disposed over the substrate, wherein the first ends of the fuse interconnects are electrically coupled to the circuit area; and forming an electrically conductive fuse line of a standard fuse length in an electrically conductive layer disposed above the plurality of electrically conductive layers, wherein the fuse line is electrically coupled to the second ends of the fuse interconnects.

17. The method according to claim 16, further comprising the step of forming a fuse window above the fuse line.

18. The method according to claim 16, further comprising the step of forming a second plurality of electrically conductive interconnects around the fuse, the second plurality of electrically conductive interconnects forming a protective guard ring.

19. The method according to claim 18, wherein portions of the interconnects forming side walls of the guard ring are bent inwardly in a manner that follows the fuse interconnects.

20. The method according to claim 18, wherein portions of the interconnects forming end walls of the guard ring are bent inwardly in a manner that follows the fuse interconnects.

21. The method according to claim 20, wherein portions of the interconnects forming side walls of the guard ring are bent inwardly in a manner that follows the fuse interconnects.

* * * * *